United States Patent [19]
Hilsum et al.

[11] 3,745,427
[45] July 10, 1973

[54] SEMICONDUCTOR DEVICE OF P-TYPE ALLOYS

[75] Inventors: Cyril Hilsum, Malvern; Huw David Rees, Malvern Link, both of England

[73] Assignee: The Secretary of State for Defence in Her Britannic Majesty's Government of the United Kingdom of Great Britain and Northern Ireland, Whitehall, London, England

[22] Filed: Mar. 30, 1972

[21] Appl. No.: 239,586

Related U.S. Application Data

[63] Continuation of Ser. No. 874,004, Nov. 14, 1969, abandoned, which is a continuation-in-part of Ser. No. 792,027, Jan. 17, 1969, abandoned.

[30] Foreign Application Priority Data

Nov. 7, 1968 Great Britain .................. 52,759/68

[52] U.S. Cl. .. 317/235 R, 317/235 K, 317/235 AC, 317/235 AM, 317/235 AD, 252/518, 148/33

[51] Int. Cl. ........................ H01l 11/00, H01l 15/00

[58] Field of Search ........................ 317/234, 25, 42, 317/25.1, 48.1, 41.1, 28, 30, 43; 252/518, 62.3; 148/33, 33.6, 175; 331/107 B; 307/205

[56] References Cited

UNITED STATES PATENTS

| | | | |
|---|---|---|---|
| 2,817,783 | 12/1957 | Loebner | 317/235 |
| 3,244,566 | 4/1966 | Mann et al. | 317/235 |
| 3,270,293 | 8/1966 | Deloach et al. | 317/235 |
| 3,324,358 | 6/1967 | Memelink | 317/235 |
| 3,335,337 | 8/1967 | Kasugai et al. | 317/234 |
| 3,424,910 | 1/1969 | Mayer et al. | 317/235 |
| 3,461,324 | 8/1969 | Barry | 307/305 |
| 3,465,159 | 9/1969 | Stern | 317/235 |
| 2,944,975 | 7/1960 | Folberth | 252/62.3 |
| 3,392,066 | 7/1968 | McDermott et al. | 148/175 |
| 3,541,404 | 11/1970 | Hilsum | 317/235 |

*Primary Examiner*—John W. Huckert
*Assistant Examiner*—Andrew J. James
*Attorney*—Cushman, Darby & Cushman

[57] ABSTRACT

A semiconductor material having the composition $InP_xAs_{1-x}$ where $x$ denotes the atomic fraction of phosphorus and lies between 0.16 and 0.65 or $In_{1-y}Ga_yAs$ where $y$ denotes the atomic fraction of gallium and lies between 0.15 and 0.43. The material may be used as a basis for a Rees diode, in which a body of extrinsic semiconductor material of the conductivity type in which the minority carriers produce avalanche multiplication at lower electric field strengths than do the majority carriers has formed on it a first heavily doped electrode of the same conductivity type as the body and a second heavily doped electrode.

2 Claims, 5 Drawing Figures

Cyril Hilsum
Huw David Rees
*Inventors*

Inventors
CYRIL HILSUM
HUW DAVID REES

SEMICONDUCTOR DEVICE OF P-TYPE ALLOYS

This application is a continuation of earlier application Ser. No. 874,004, filed Nov. 14, 1969, now abandoned, which in turn is a continuation-in-part of earlier application Ser. No. 792,027 filed Jan. 17, 1969 and now abandoned.

The present invention relates to semiconductor material and devices.

The specification of Patent Application Ser. Nos. 040427 (Canada) or 792,027 (U.S.A.) filed Jan. 17, 1969, by Huw David Rees, now abandoned which is propaedeutic to this specification, describes semiconductor devices having two or more terminals and including a body of semiconductor material which is an extrinsic conductor of the conductivity type in which the minority carriers produce avalanche multiplication at lower electric field strengths than do the majority carriers, on which are formed a first heavily doped electrode of the same conductivity type as the body and a second heavily doped electrode.

Such a semiconductor device will be described hereinafter as a device of the type described.

The basic electrical requirements for the semiconductor material forming the body of the semiconductor devices are (1) the semiconductor must be extrinsic at the temperature at which the device is to be used, and (2) for any given electric field the ratio of the minority carrier avalanche ionisation rate to the majority carrier ionisation rate must be large.

In addition, the maximum speed at which the device will operate increases with the velocity in high electric fields of minority carriers. Therefore the desirable property of fast operation is obtained when a third condition is met, that is (3) the velocity in high fields of the minority carriers is large.

For most device applications cooling is undesirable or not acceptable. Therefore, according to requirement (1) above, the semiconductor material must be extrinsic up to temperatures slightly above ambient, approximately 300° K, and preferably should be extrinsic up to temperatures well above 300° K. It is also desirable that the material has a large thermal conductivity, so that the devices can dissipate high power without becoming very hot.

According to the present invention there is provided a semiconductor material having the composition $InP_xAs_{1-x}$ where $x$ denotes the atomic fraction of phosphorus and lies between 0.16 and 0.65 or $In_{1-y}Ga_yAs$ where $y$ denotes the atomic fraction of gallium and lies between 0.15 and 0.43.

According to an aspect of the invention there is provided a device of the type described made from a single crystal of an alloy $InP_xAs_{1-x}$ where $x$ denotes the atomic fraction of phosphorus and lies between 0.16 and 0.65 or of an alloy $In_{1-y}Ga_yAs$ where $y$ denotes the atomic fraction of gallium and lies between 0.15 and 0.43.

An embodiment of the invention will be described by way of example with reference to the accompanying drawings, in which.

Figure 1:
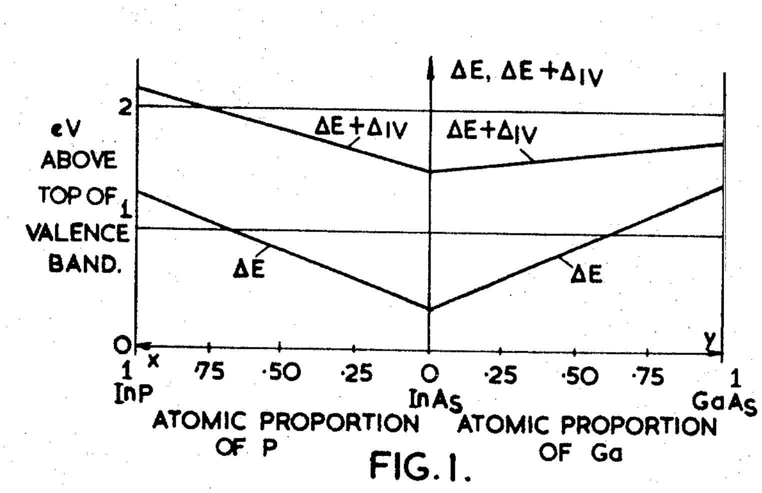
FIG. 1 is a graph of energy transitions plotted against composition in the systems InAs/InP and InAs/GaAs.

A flat piece of p-type semiconductor 1 has a circular cathode 3 on one side and a circular anode 5 on the other side in juxtaposition to the cathode 3. The area of the anode 5 is preferably less than the area of the cathode 3.

The basic electrical requirements set out above are as follows:

1. the semiconductor must be extrinsic at the temperature at which the device is to be used;
2. for any given electric field the ratio of the minority carrier avalanche ionisation rate to the majority carrier ionisation rate must be large; and
3. the velocity in high fields of the minority carriers must be large.

Two obvious materials well satisfying conditions (2) and (3) above and $p$ type InSb and $p$ type InAs. However condition (1) would restrict the maximum operating temperature to about 150° K in the case of InSb and about 220° K in the case of InAs. Therefore neither material is suitable for use in a device operating at room temperature. For operation at room temperature the forbidden energy gap of the semiconductor should be greater than about 0.5 eV.

GaAs and InP both have energy gaps of about 1.4 eV and so satisfy well condition (1) at room temperature. However, in both these materials the electrons transfer in high fields from conduction band states of high velocity to states of low velocity. On the context of the present device this is undesirable for two reasons. Firstly the electron avalanche rate is reduced, which is undesirable from the point of view of condition (2). Secondly the speed of operation of the device is reduced due to condition (3). Conditions (2) and (3) would be well satisfied if the band structure of the semiconductor was such that the electrons in the conduction band could achieve energies high enough to generate electron hole pairs by ionisation, while still having too little energy to transfer to low velocity conduction band states. Therefore the separation between the lowest energy state in the conduction band and the lowest energy low mobility state in the conduction band should exceed the separation $\Delta E$ between the highest energy state in the valence band and the lowest energy state in the conduction band. In suitable materials, electrons in the bottom of the conduction band will have a high mobility and holes in the valence band will have a low mobility. Let us denote by $\Delta_{IV}$ the energy separation between the bottom of the conduction band and the lowest energy low mobility states in the conduction band. Provided $\Delta_{IV} > \Delta E$, electrons in the conduction band will attain the minimum energy to generate an electron-hole pair by ionisation (which energy is approximately $\Delta E$) before transferring to the low mobility states. In this circumstance, the electron avalanche ionisation rate will be much greater than if transfer had occurred, and will therefore exceed the hole avalanche rate by a larger amount. In addition, the electron velocity will be larger in an electric field strong enough to produce avalanche ionisation. Therefore conditions (2) and (3) are best satisfied if the ratio $\Delta_{IV}/\Delta E$ is greater than unity. The device will operate in materials with a smaller ratio than unity, but the performance will be better in those p type materials where the ratio exceeds unity.

We therefore seek a material with

1. $\Delta E > 0.5$ eV
2. $\Delta_{IV}/\Delta E > 1$.

We have recently discovered that in InP the ratio $\Delta_{IV}/\Delta E$ is larger than had previously been accepted. The ratio $\Delta_{IV}/\Delta E$ is about 0.6, which is not quite large enough for our purpose, but is large enough to make the alloys of InP with InAs particularly and unexpectedly favourable for a diode of the type described. Another alloy system which should be favourable for certain requirements is that of GaAs with InAs. In this system the electron mobility is slightly higher than in the InP-InAs system, so that the speed of the diode might be slightly faster.

FIG. 1 is a graph of energy transitions plotted against composition in the systems InAs/InP and InAs/GaAs at room temperature. The abscissa on the left hand side of the ordinate axis is atomic proportion $x$ of phosphorus in $InP_xAs_{1-x}$ and the abscissa on the right hand side of the ordinate axis is atomic proportion y of gallium in $In_{1-y}Ga_yAs$. The ordinates are $\Delta E$, the energy separation between the highest energy state in the valence band and $\Delta E + \Delta_{IV}$, the lowest energy state in the conduction band. The abscissa axis corresponds therefore to the top of the valence band.

In the graphs $\Delta E$, which has a value of 0.35 electron volts for InAs, rises roughly linearly with $x$ to a value of 1.3 electron volts for InP, and roughly linearly with $y$ to a value of 1.4 electron volts for GaAs. Similarly $\Delta E + \Delta_{IV}$, which has a value of 1.5 electron volts for InAs, rises roughly linearly with $x$ to a value of 2.15 electron volts for InP and roughly linearly with y to a value of 1.75 electron volts for GaAs.

The relationships may be written as linear equations $$\Delta E = 0.95\,x + 0.35$$

$$\Delta_{IV} = -0.3\,x + 1.15$$

$$\text{and } \Delta E = 1.05\,y + 0.35$$

$$\Delta_{IV} = -0.8\,y + 1.15.$$

These two sets of simultaneous equations, taken with the inequalities $\Delta E > 0.5$ and $\Delta_{IV}/\Delta E > 1$ provide two ranges of acceptable materials, namely $y = 0$, $0.158 < x < 0.64$ and $x = 0$, $0.143 < y < 0.432$.

Figures 2, 3:
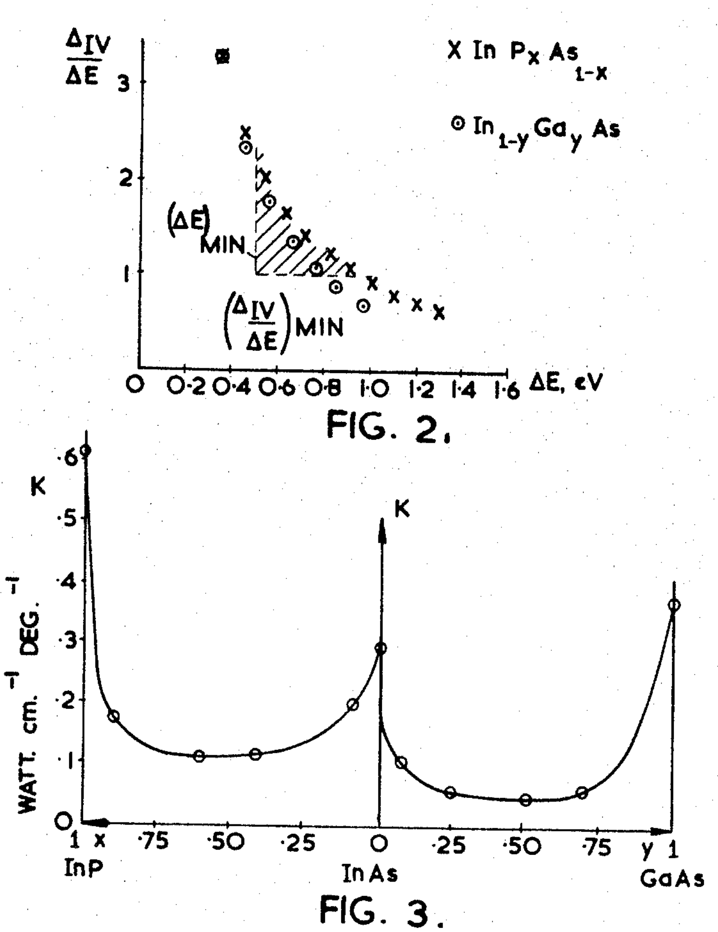
FIG. 2 is a graph of $\Delta_{IV}/\Delta E$ plotted against $\Delta E$ for the components $InP_xAs_{1-x}$ and $In_{1-y}Ga_yAs$.
FIG. 3 is a graph of thermal conductivity plotted against composition in the systems InAs/InP and InAs/GaAs.

Alternatively the graphs may be converted into graphs plotting $\Delta_{IV}/\Delta E$ against $\Delta E$ for the two systems InAs/InP and InAs/GaAs, and this is done in FIG. 2. A broken line $(\Delta E)_{min}$ marks $\Delta E = 0.5$ and a broken line $(\Delta_{IV}/\Delta E)_{min}$ marks $\Delta_{IV}/\Delta E = 1$; acceptable materials lie on the graphs between the lines, in an area which is shaded in the drawing.

The precise composition chosen will depend on the operating temperature required. For high ambient temperatures and high power inputs the InAsP alloy with higher phosphorus content is preferred, since a larger energy gap is then useful. A further important property of this alloy system in this context is its thermal conductivity which is relatively high.

FIG. 3 is a graph of thermal conductivity plotted against composition in the systems InAs/InP and InAs/GaAs. The abscissas on the graph are exactly as in FIG. 1 but the ordinate is thermal conductivity K. Sample values of the thermal conductivity $K$ of the compounds $In_{1-y}Ga_yAs$ and $InP_xAs_{1-x}$ in watts. $cm^{-1}$. $deg.^{-1}$ are as follows.

| $x$ | $k$ | $y$ | $k$ |
|---|---|---|---|
| (InP)1 | 0.615 | (GaAs)1 | 0.37 |
| 0.9 | 0.17 | 0.7 | 0.06 |
| 0.6 | 0.11 | 0.5 | 0.045 |
| 0.4 | 0.11 | 0.25 | 0.06 |
| 0.08 | 0.2 | 0.08 | 0.1 |
| (InAs)0 | 0.29 | (InAs)0 | 0.29 |

Indium phosphide arsenide and indium gallium arsenide may be prepared in a conventional manner by melt growth, solution growth or vapor or liquid epitaxy.

For example, phosphorus and arsenic may be dissolved in an excess of indium at a temperature where the solution is liquid. On cooling the solution, crystal of indium phosphide arsenide are deposited either epitaxially on a single crystal seed of indium arsenide, gallium arsenide, indium phosphide or indium phosphide arsenide or otherwise. Indium phosphide is deposited preferentially so the initial composition must contain a higher proportion of arsenic than is desired in the alloy.

In the case of indium gallium arsenide, gallium and arsenic may be dissolved in an excess of indium. The other steps in the process will be similar. Gallium arsenide is deposited preferentially so the initial composition must in any case contain a higher proportion of indium than is desired in the alloy.

Alternatively a gas mixture comprising arsenic, phosphorus, one or more of the chlorides of indium and hydrogen may be passed over a single crystal seed of indium arsenide, gallium arsenide, indium phosphide or indium phosphide arsenide so that epitaxial deposition takes place. A possible means for obtaining the gas mixture is to pass arsenic trichloride, $AsCl_3$, and phosphorus trichloride, $PCl_3$, in a stream of hydrogen over liquid indium at an elevated temperature, normally around 750° C. The hydrogen reduces the arsenic and phosphorus chlorides to free arsenic and phosphorus, forming hydrogen chloride, HCl. Initially the arsenic and phosphorus dissolve in the indium. When the indium is saturated with arsenic and phosphorus, the arsenic and phosphorus, together with indium chloride, InCl, generated from the reaction of the hydrogen chloride with the indium, and excess hydrogen pass into the gas stream. An alternative method for obtaining the required gas mixture is to pass arsenic trichloride in hydrogen over indium phosphide at an elevated temperature around 750° C.

In the case of indium gallium arsenide, arsenic trichloride gas with hydrogen may be passed over a mixture of liquid indium and liquid gallium. The hydrogen reduces the arsenic trichloride to free arsenic, forming hydrogen chloride. Initially the arsenic dissolves in the liquid. When the liquid is saturated with arsenic, the arsenic, together with indium and gallium chlorides generated from the reaction of the hydrogen chloride with the indium and the gallium, and excess hydrogen pass into the gas stream.

We claim:

1. A semiconductor device comprising a body of semiconductor material selected from the group of semi-conductor materials consisting of p-type $InAs_{1-x}P_x$ alloys where $x$ denotes the atomic fraction of phosphorus and lies between 0.16 and 0.65 and p-type $In_{1-y}Ga_yAs$ alloys where $y$ denotes the atomic fraction of gallium and lies between 0.15 and 0.43, a cathode on said body and an anode on said body, said cathode is of a material of the type from which a small number of minority carriers are injected into said body and means connected to said anode and said cathode for applying between said cathode and said anode a voltage sufficient to cause a minority carrier avalanche in said body.

2. A semiconductor device as claimed in claim 1 wherein the semiconductor material is a single crystal.

* * * * *

UNITED STATES PATENT OFFICE
CERTIFICATE OF CORRECTION

Patent No. 3,745,427 Dated July 10, 1973

Inventor(s) Cyril Hilsum et al.

It is certified that error appears in the above-identified patent and that said Letters Patent are hereby corrected as shown below:

The illustrative figure on the cover sheet should appear as shown below:

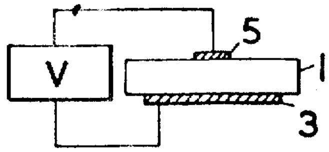

Figure 4:
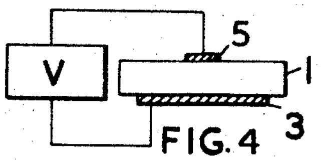
FIG. 4 is a cross-sectional diagram.
Figure 3:
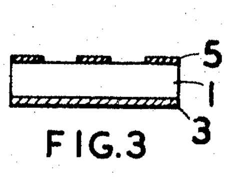
Figure 5:
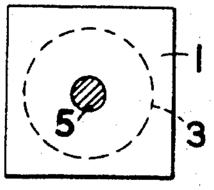
FIG. 5 is a plan view of a two terminal semiconductor device embodying the invention.
Figure 4:
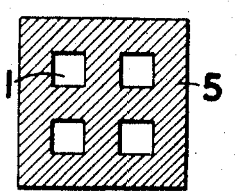
Figure 5:
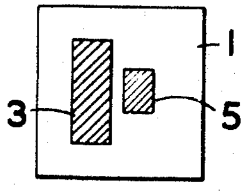
Figure 6:
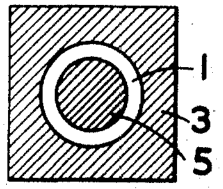
Figure 7:
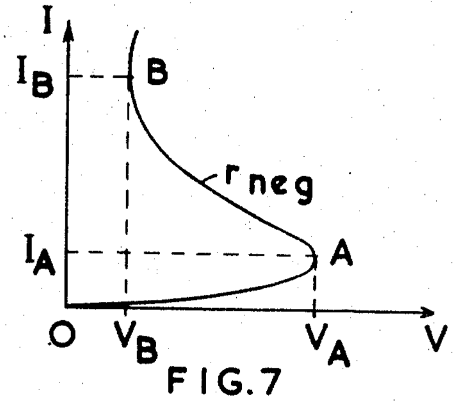
Figure 8:
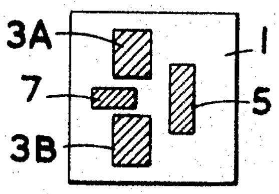
Figure 9:
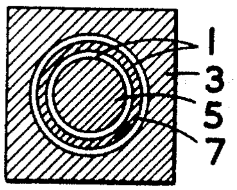
Figure 10:
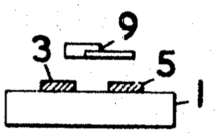

Under the Abstract "5 Drawing Figures" should read -- 2 Drawing Figures --; Cancel Figures 3-10 appearing on Sheet 2 of the drawings with the exception of Figures 4 and 5 appearing in the upper left-hand column of Sheet 2 of the drawings; On page 1, block No. 30, add the following to the Priority Data: -- January 18, 1968 Great Britain....2791/68 --.

Signed and sealed this 12th day of November 1974.

(SEAL)
Attest:

McCOY M. GIBSON JR.
Attesting Officer

C. MARSHALL DANN
Commissioner of Patents